United States Patent
Best et al.

(10) Patent No.: US 11,699,003 B2
(45) Date of Patent: Jul. 11, 2023

(54) PORTABLE FLEXIBLE AGENTS FOR SIMULATION

(71) Applicant: TOYOTA RESEARCH INSTITUTE, INC., Los Altos, CA (US)

(72) Inventors: Andrew P. Best, Sunnyvale, CA (US); Chien-Liang Fok, Belmont, MA (US); Sachit P. Vithaldas, Mountain View, CA (US)

(73) Assignee: Toyota Research Institute, Inc., Los Altos, CA (US)

( * ) Notice: Subject to any disclaimer, the term of this patent is extended or adjusted under 35 U.S.C. 154(b) by 262 days.

(21) Appl. No.: 17/098,692

(22) Filed: Nov. 16, 2020

(65) Prior Publication Data

US 2022/0156431 A1 May 19, 2022

(51) Int. Cl.
*G06F 30/15* (2020.01)
*G06F 30/20* (2020.01)

(52) U.S. Cl.
CPC .............. *G06F 30/20* (2020.01); *G06F 30/15* (2020.01)

(58) Field of Classification Search
CPC ................................ G06F 30/20; G06F 30/15
See application file for complete search history.

(56) References Cited

U.S. PATENT DOCUMENTS

| 7,680,639 B2 | 3/2010 | Schoeggl | |
|---|---|---|---|
| 10,540,456 B2 | 1/2020 | Nica et al. | |
| 2019/0146492 A1* | 5/2019 | Phillips | G09B 19/16 701/23 |
| 2021/0350046 A1* | 11/2021 | Bosson | G06F 30/27 |

FOREIGN PATENT DOCUMENTS

| CN | 107179196 A | 9/2017 |
|---|---|---|
| CN | 109556880 A | 4/2019 |
| JP | 2015028725 A | 2/2015 |

OTHER PUBLICATIONS

Reminov et al. WO21016/133422 (Year: 2016).*
Chan et al. KR 20170108730 (Year: 2017).*

* cited by examiner

*Primary Examiner* — Rehana Perveen
*Assistant Examiner* — Cuong V Luu
(74) *Attorney, Agent, or Firm* — Dinsmore & Shohl LLP

(57) ABSTRACT

A simulation system includes a storage module comprising a plurality of behaviors and an electronic control unit. The electronic control unit is configured to define an agent for use in a simulation, where the agent comprises one or more of the plurality of behaviors from the storage module and the agent is capable of implementation on a plurality of different simulators, establish a contract with a first simulator and the agent to provide a consistent boundary between the agent and the first simulator, and execute the simulation of a device in a simulation environment with the first simulator and the agent.

17 Claims, 5 Drawing Sheets

PORTABLE FLEXIBLE AGENTS FOR SIMULATION

TECHNICAL FIELD

The present specification generally relates to simulator frameworks for implementing portable agents, more specifically, to systems and methods for implementing portable flexible agents that are not tied to a particular simulator by establishing contracts to that enable an agent to be implemented across simulator platforms.

BACKGROUND

Designing a vehicle includes performing various tests on the design that simulate conditions a vehicle may experience. Currently, various tests are implemented using a plurality of different simulators to complete the simulations, including a high-fidelity simulation platform, which is a detailed platform having a variety of sensor implementations that provides a realistic simulation. However, because of this robustness, the high-fidelity simulation platform runs simulations very slowly. Another type of simulator is a low-fidelity simulation platform, which is a high-fidelity simulator that has limited sensor information, but allows for testing to be run faster relative to the high-fidelity simulation platform. Both platforms use intelligent virtual agents that place a plurality of conditions on a vehicle that are specific to the simulator platform. However, the agents are simulator-specific, such that the agents have to be rewritten every time a new simulator is utilized.

Accordingly, there exists a need for virtual agents that place a plurality of specific behaviors under repeatable conditions on a vehicle and are portable between types of simulators so they do not need to be redeveloped for the various types of simulators needed to test vehicle designs.

SUMMARY

In embodiments, a simulation system includes a storage module comprising a plurality of behaviors, and an electronic control unit. The electronic control unit is configured to define an agent for use in a simulation, where the agent comprises one or more of the plurality of behaviors from the storage module and the agent is capable of implementation on a plurality of different simulators, establish a contract with a first simulator and the agent to provide a consistent boundary between the agent and the first simulator, and execute the simulation of a device in a simulation environment with the first simulator and the agent.

In some embodiments, a method includes defining an agent for use in a simulation, where the agent comprises one or more behaviors from a storage module and the agent is capable of implementation on a plurality of different simulators, establishing a contract with a selected simulator and the agent to provide a consistent boundary between the agent and the selected simulator, and executing the simulation of a device in a simulation environment with a first simulator and the agent.

In some embodiments, a computing program product includes instructions, which when executed by a computing device, cause the computing device to carry out steps including: defining an agent for simulation, wherein the agent comprises one or more behaviors from a storage module and the agent is capable of implementation on a plurality of different simulators; establishing a contract with a selected simulator and the agent to provide a consistent boundary between the agent and the selected simulator; and causing a simulator to execute the simulation of a device with a first simulator and the agent.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
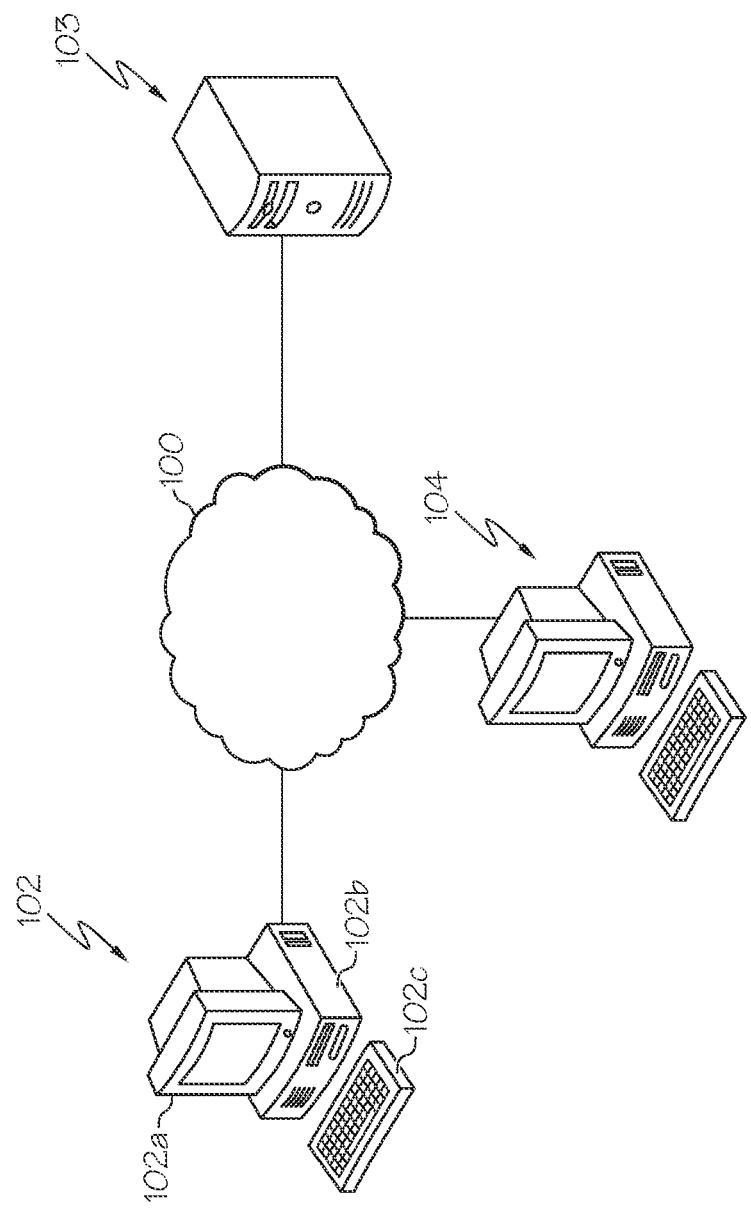
FIG. 1 schematically depicts an example computing network for performing simulations of a device, according to one or more embodiments shown and described herein.

Embodiments of the present disclosure provide an architecture that allows for the development of agents that are portable between different simulators. The architecture (i.e., framework) of the present disclosure establishes a contract between an agent controller and the simulator to provide a consistent boundary between the two so that an agent can be written just once and used in multiple simulators, if the contract is met. The contract defines an interface layer that maps the data sources of agents to the simulator. Within the framework, all the behaviors themselves are designed to be composable. That is, rather than establishing a vehicle that is going to change lanes, handles the breaks, etc., in a monolithic fashion, the present disclosure implements and assigns behavior primitives to the agents and relates them to the simulator via contracts.

The behavior primitives are pieces of framework that are composed and reused in different agents. For example, one behavior may instruct a vehicle to follow an existing lane on a road and another behavior may instruct a vehicle to not tailgate a lead car. The behaviors establish a clear set of boundary conditions for a large number of agent behaviors so that when it is desired to construct an agent having several specific behaviors, the behavior primitives can be selected accordingly for the agent.

Once an agent has been designed with a set of the proposed behaviors, the agent does not have to be rewritten for future use. Rather, the agent will perform consistently with a simulated world. In some embodiments, each of the behaviors may be stored in a library for future use. Further, each of the agents having a selected set of behaviors can also be stored in a library for future use.

The stored behaviors and agents may provide a logical safeguard. That is, an expensive and time consuming simulation does not need to be run to determine whether a particular agent is or is not going to work because as soon as an agent is constructed from select ones of the behavior primitives that the agent will work, thereby saving time. The logical safeguard is also easy to visualize. In the case of a monolithic agent (e.g., when attempting to write one agent that is going to do everything) the result is a lot of code that is difficult to understand. However, because the present disclosure relates to selecting behavior primitives, at run time, each of the behaviors can be inspected independently so one knows exactly why a particular action did not happen or why it happened differently than expected. For example, in a simulation, a vehicle may be following a lead car, but it may turn out that because of a map error, the agent thought the lead car was a different vehicle, not the car directly in front of it, which causes a vehicle crash.

In some embodiments, the agents described herein allow for positional flexibility. That is, if the final action of an actor in a simulated scene is the result of a plurality of specific behaviors composed together, a change in the ordering of behaviors may result in different outcomes.

Embodiments that will now be described in detail relate to an architecture that allows for the development of agents that are made up of a plurality of behavior primitives that allow the agents to be portable to different simulators. In addition, the agents can be composed by arranging selected behavior primitives, which eliminates a need for parsing code to determine what particular actions an agent is going to take under certain conditions. The order of behaviors can also be moved around within an agent to determine whether it results in different simulated results.

The following will now described the framework, systems, and methods in more detail with reference to the drawings where like number refer to like structures.

Referring now to the drawings, FIG. 1 depicts an example computing network for performing simulations of a device, according to one or more embodiments shown and described herein. As illustrated in FIG. 1, a network 100 may include a wide area network, such as the internet, a local area network (LAN), a mobile communications network, a public service telephone network (PSTN) and/or other network and may be configured to electronically connect a user computing device 102, a computing device 103 for performing a simulation, and an administrator computing device 104.

The user computing device 102 may include a display 102a, a processing unit 102b and an input device 102c, each of which may be communicatively coupled to together and/or to the network 100. The user computing device 102 may be used to develop a simulation environment, construct an agent, define behavior primitives, configure a device such as a virtual autonomous vehicle, or the like. The computing device 103 may be implemented with storage module (e.g., a memory component 240 and/or a data storage component 236, FIG. 2), an electronic control unit (e.g., a processor 230, FIG. 2) to execute a simulation using one or more different types of simulators.

Additionally, included in FIG. 1 is the administrator computing device 104. In the event that the computing device 103 requires oversight, updating, or correction before, during, or after executing a simulation, the administrator computing device 104 may be configured to provide the desired oversight, updating, and/or correction interface capabilities.

It should be understood that while the user computing device 102 and the administrator computing device 104 are depicted as personal computers and the computing device 103 is depicted as a server, these are merely examples. More specifically, in some embodiments, any type of computing device (e.g., mobile computing device, personal computer, server, and the like) may be utilized for any of these components. Additionally, while each of these computing devices is illustrated in FIG. 1 as a single piece of hardware, this is also an example. More specifically, each of the user computing device 102, the computing device 103, and administrator computing device 104 may represent a plurality of computers, servers, databases, and the like. Conversely, each of the components may be employed together as a single computing device.

Figure 2:
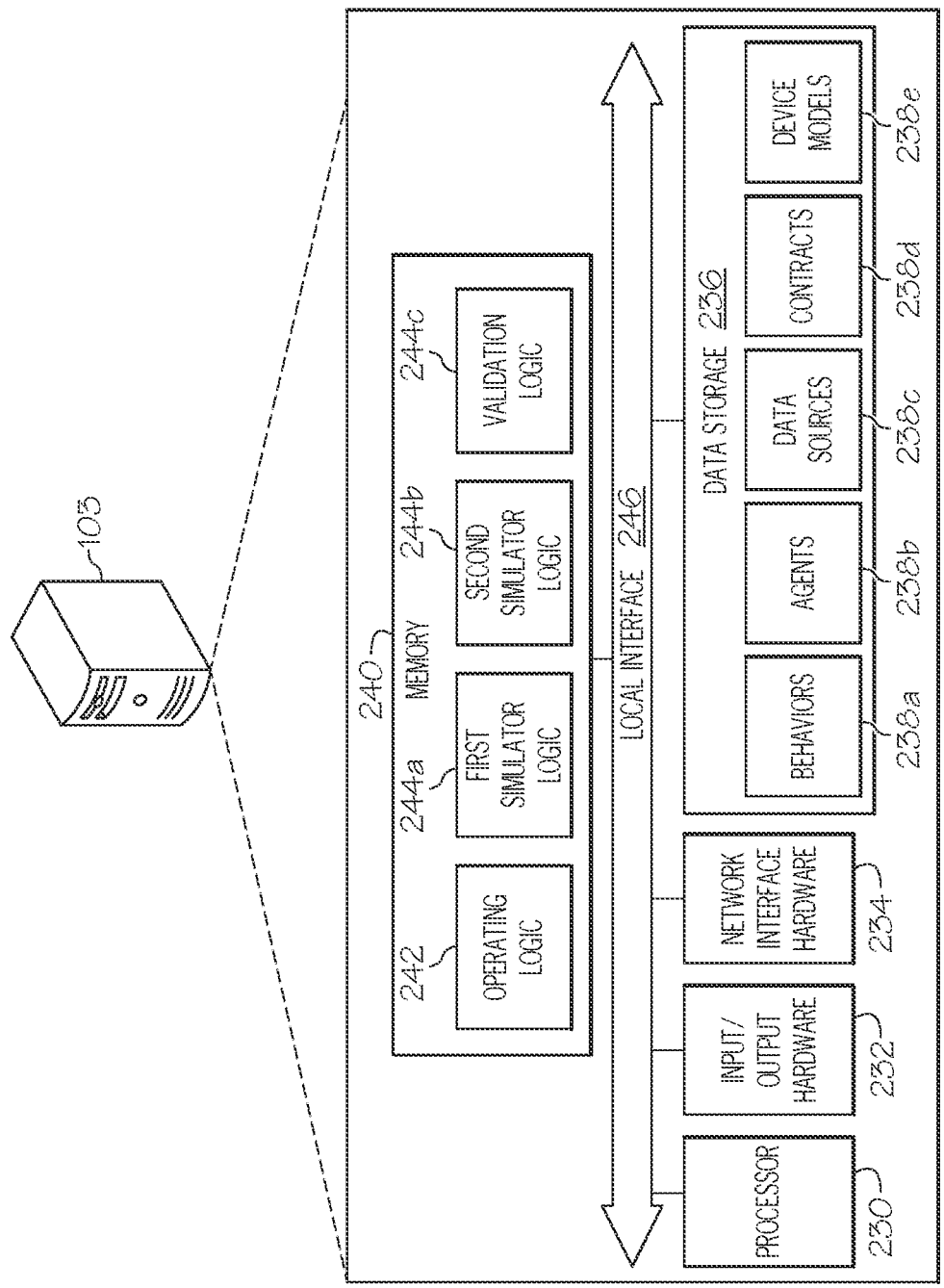
FIG. 2 schematically depicts an example computing device for performing simulations of a device, according to one or more embodiments shown and described herein.

FIG. 2 depicts an example computing device 103 for performing simulations of a device in model or design form, from FIG. 1, while further illustrating aspects of the simulation system. The computing device 103 may utilize hardware, software, and/or firmware, according to embodiments shown and described herein. While in some embodiments, the computing device 103 may be configured as a general-purpose computer with the requisite hardware, software, and/or firmware, in some embodiments, the computing device 103 may be configured as a special purpose computer designed specifically for performing the functionality described herein.

As also illustrated in FIG. 2, the computing device 103 may include a processor 230, input/output hardware 232, network interface hardware 234, a data storage component 236, which stores a library of behaviors 238a, a library of agents 238b, data sources 238c, contracts 238d, and device models 238e, and a memory component 240. The memory component 240 may be machine-readable memory (which may also be referred to as a non-transitory processor readable memory). The memory component 240 may be configured as volatile and/or nonvolatile memory and, as such, may include random access memory (including SRAM, DRAM, and/or other types of random access memory), flash memory, registers, compact discs (CD), digital versatile discs (DVD), and/or other types of storage components. Additionally, the memory component 240 may be configured to store operating logic 242, a first simulator logic 244a, a second simulator logic 244b, and validation logic 244c (each of which may be embodied as a computer program, firmware, or hardware, as an example). A local interface 246 is also included in FIG. 2 and may be implemented as a bus or other interface to facilitate communication among the components of the computing device 103.

The processor 230 may include any processing component(s) configured to receive and execute programming instructions (such as from the data storage component 236 and/or the memory component 240). The instructions may be in the form of a machine-readable instruction set stored in the data storage component 236 and/or the memory component 240. The processor 230 is also referred to herein as an electronic control unit. The input/output hardware 232 may include a monitor, keyboard, mouse, printer, camera, microphone, speaker, and/or other device for receiving, sending, and/or presenting data. The network interface hardware 234 may include any wired or wireless networking hardware, such as a modem, LAN port, Wi-Fi card, WiMax card, mobile communications hardware, and/or other hardware for communicating with other networks (e.g., network 100) and/or devices (e.g., the user computing device 102 and/or the administrator computing device 104).

It should be understood that the data storage component 236 may reside local to and/or remote from the computing device 103 and may be configured to store one or more pieces of data for access by the computing device 103 and/or other components. As illustrated in FIG. 2, the data storage component 236 stores a library of behaviors 238a. The library of behaviors 238a or behavior primitives are pieces of framework that are composed and reused in different agents. The behaviors 238a define a behavior that an agent may employ along with a set of boundary conditions for the behavior. For example, one behavior may instruct a device such as a vehicle to follow an existing lane on a road and a second behavior may instruct the vehicle to maintain a trailing distance from another vehicle (e.g. an agent) in the simulation environment. Other behaviors 238a, when implemented with an agent, may cause the agent to travel below the speed limit or make a turn without signaling, or behave like a distracted driver and thus make erratic maneuvers. The behaviors 238a may also be more typical of an attentive driver and include stopping at a stop sign and then turning when it is its turn to move again. These are only a few examples of the many different types of behaviors 238a. Additionally, although these behaviors 238a are presented in the context of a vehicle, behaviors 238a may also include a traffic light signaling sequence, the movement of a pedestrian crossing a crosswalk, or how a cyclist may maneuver through traffic on a road shared with vehicles.

The data storage component 236 may further store a library of agents 238b. The agents 238b are predefined entities within a simulation that are constructed through a selection of one or more behaviors 238a. Agents 238b are independent actors that have the ability to plan, act, and react to other agents within the simulation environment. Furthermore, the agents 238b may be controlled independently. That is, although the agents may react to other agents or the ego device being tested during the simulation, agents 238b are not passive components of the simulation environment. Some examples of agents 238b include but are not limited to other vehicles, pedestrians, traffic lights, cyclists, roads (e.g., road conditions or types, such as wet, dry, asphalt, gravel, or the like), weather elements, or the like.

Data sources 238c are also stored in the data storage component 236. Data sources 238c includes the variables and corresponding values that agents update and/or write values to in response to their behavior sequence and which the simulators use to compute an action or reaction of the ego device (i.e., device being simulated). In some embodiments, the simulators may write values to the data sources 238c of a corresponding agent 238b, however, this is generally only an initialization process of a simulation. The contracts 238d are the linking logic that configures and links the agents 238b with the simulators via the data sources 238c. In other words, contracts 238d assure that agents 238b provide the necessary data sources 238c for a simulator to operate and further provide an interface layer in which the data sources 238c are accessible to both the agents 238b and the simulator. An example of a contract 238d between a non-ego vehicle agent and an ego vehicle being simulated may be the linking of data sources that define the driving behavior of the non-ego vehicle agent. As the simulator advances time of the simulation, the non-ego vehicle agent 238b executes a sequence of behaviors 238a that update steering values, speed values, heading values, braking values, acceleration values, and the like. The values when stored in the data sources may be used by the simulator to compute the appropriate response of the ego vehicle being simulated. For example, if an adaptive cruise control functionality of an autonomous vehicle, which is the ego vehicle, that is configured to follow a non-ego vehicle agent, the simulator will need to track the data sources related to the behavior of the non-ego vehicle agent to develop an appropriate response of the ego vehicle. The response may be driven by a physics and/or mathematical representation of the adaptive cruise control of the ego vehicle.

In an event that a simulator requires a data source 238c that is not provided by an agent 238b or updated by an agent 238b, then a contract 238d may not be validly formed thereby raising an exception to the simulator configuration before the simulator is executed. That is, contacts 238d between an agent 238b and the simulator provide a consistent boundary between the two so that an agent can be written once and used in a variety of simulators because the contact 238d provides the simulator with the necessary links to the data sources the agent 238b and its implemented behaviors write and update values to during execution of the simulation.

It should also be understood that contracts 238d may be established between agents 238b of a simulation. For example, a weather agent that defines weather behavior in an environment may affect a braking behavior of a non-ego vehicle agent. That is, the braking behavior of the non-ego vehicle agent may have rely on a data source that indicates whether it is raining or not and thus influences the braking distance of a braking behavior when the braking behavior is activated by the non-ego vehicle agent.

The data storage component 236 may also store device models 238e. The device models 238e are computer-coded representations of a device that is simulated. For example, a device model 238e may be, for example, but without limitation, a device such as an autonomous vehicle, a semi-autonomous vehicle, a robot, an automated manufacturing system or the like. The device model 238e may include code defining the physics of the device and its systems. The device model 238e may model all or part of the device. For example, the entire functionality of an autonomous vehicle may not need to be modeled if the simulation is intended to focus on simulating the navigation and/or following functionality of the vehicle and not the mechanics and operations of a door or trunk.

Still referring to FIG. 2, included in the memory component 240 are the operating logic 242, the first simulator logic 244a, the second simulator logic 244b, and the validation logic 244c. The operating logic 242 may include an operating system and/or other software for managing components of the computing device 103. The first simulator logic 244a may be configured to implement a first type of simulator such as a high-fidelity simulator. The second simulator logic 244b may be configured to implement a second type of simulator such as a low-fidelity simulator. However, it is not a requirement that the computing device includes more than one simulator type. Additionally, the high-fidelity simulator and low-fidelity simulator are mere examples, and it should be understood that other types of simulators may be implemented. The first simulator logic 244a and/or the second simulator logic 244b (collectively referred to herein as simulators) comprise software that with a design model 238e enables a realistic imitation of the operation of the device for testing and design purposes. The simulators may be off-the-shelf simulators configured to operate through an interface layer defined by the contract 238d that provides links between the agents 238b, their behaviors 238a, and the data sources 238c. The simulators, depending on their type, may require different data sources 238e to enable simulation of the device. Furthermore, the simulators may be bounded by constraints such as the environment, which the device is intended to function. The constraints may be updated from time to time based on dynamics within the environment, such as the behavior of a traffic light changing from "GO" to a "STOP" signal or a non-ego vehicle agent applying its brakes as a pedestrian or animal steps out into the roadway. The simulator is configured to implement steps forward in time and generate a simulated response of the device being simulated.

The memory component 240 may further include validation logic 244c. The validation logic 244c may be software and/or hardware configured to determine whether valid contracts 238d are established between the agents 238b, their behaviors 238a, and the simulators. That is, the validation logic 244c confirms that the contracts 238d initialize and/or link the necessary data sources 238c for a simulator to operate with the predefined set of agents 238b and their behaviors 238a. For example, the validation logic 244c can provide a test engineer that is designing a simulation a "GO" or "No-GO" with respect to whether the agents 238b and their behaviors 238a are adequately linked with the simulator via the contract 238d they have written. This logic measure provides a logical safeguard that enables a developer to adjust the linkage of data sources before a simulator is executed to ensure the simulator does not fail do to a missing data source or incorrect linkage.

Another aspect of the contracts 238d and the validation logic 244c is that each may be used to complete a post-mortem of the simulation to understand exactly why a particular action may not have happened or why it happened differently than expected. For example, in a simulation, an ego-vehicle may be following a lead non-ego vehicle, but it may turn out that because of a map error, the ego-vehicle was following a different non-ego vehicle, which was not the vehicle directly in front of it.

The illustrative architecture described with reference to at least FIG. 2 of the present disclosure enables the establishment of a contract between an agent controller and the simulator underneath to provide a consistent boundary between the two so that an agent can be written just once and used in multiple simulators, if the contract is met. In general, a contract 238d is met when the data sources 238c required by a simulator are made available by the agents 238b and their sequence of behaviors 238a.

It should be understood that the components illustrated in FIG. 2 are merely exemplary and are not intended to limit the scope of this disclosure. More specifically, while the components in FIG. 2 are illustrated as residing within the computing device 103, this is merely an example. In some embodiments, one or more of the components may reside external to the computing device 103. Similarly, while FIG. 2 is directed to the computing device 103, other components such as the user computing device 102 and the administrator computing device 104 may include similar hardware, software, and/or firmware.

Figure 3:
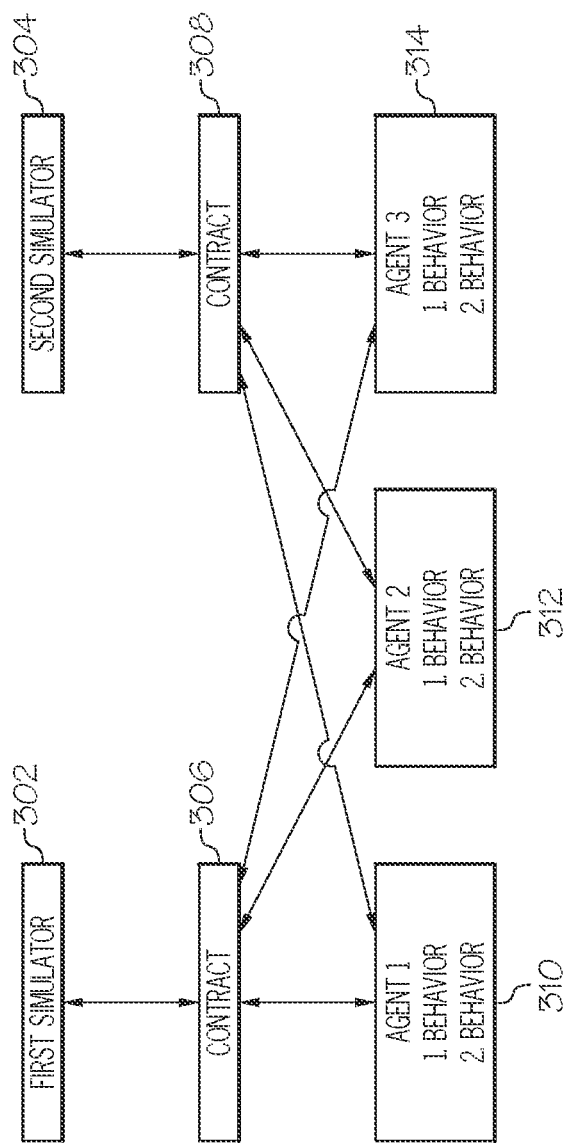
FIG. 3 depicts an illustrative block diagram depicting the relationship between simulators, contracts, data sources, agents, and behaviors, according to one or more embodiments shown and described herein.

Referring now to FIG. 3, an illustrative block diagram depicting the relationship between simulators, contracts, data sources, agents, and behaviors, as described herein, is depicted. The block diagram depicts the logical linkage between simulators 302 and 304 and agents 310, 312, and 314. As described above, the incorporation of contracts 306 and 308 enables agents 310, 312, and 314 to be used with various types of simulators without having to be rewritten to function, for example, in a monolithic way with the simulator. For example, a first simulator 302 implements Agent 1 310, Agent 2 312 and Agent 3 314 through contract 306. Contract 306 provides the interfacing necessary for the data sources and behaviors associated with Agent 1 310, Agent 2 312 and Agent 3 314 to be utilized by the first simulator 302. Additionally, a second simulator 304, which is different from the first simulator 302, implements Agent 1 310, Agent 2 312 and Agent 3 314 through contract 308. Contract 308 provides the interfacing necessary for the data sources and behaviors associated with Agent 1 310, Agent 2 312 and Agent 3 314 to be utilized by the second simulator 304. Accordingly, each of the multiple agents do not need to be written to specifically interface with the simulator that implements them. Instead, a developer may simply configure a contract (e.g., 306 and 308) that interfaces the data sources written and/or updated by the various agents (e.g., 310, 312, and 314) with the prescribed simulator type. It is the concept and formation of these contracts that enables an agent to be a portable between simulators.

Figure 4:
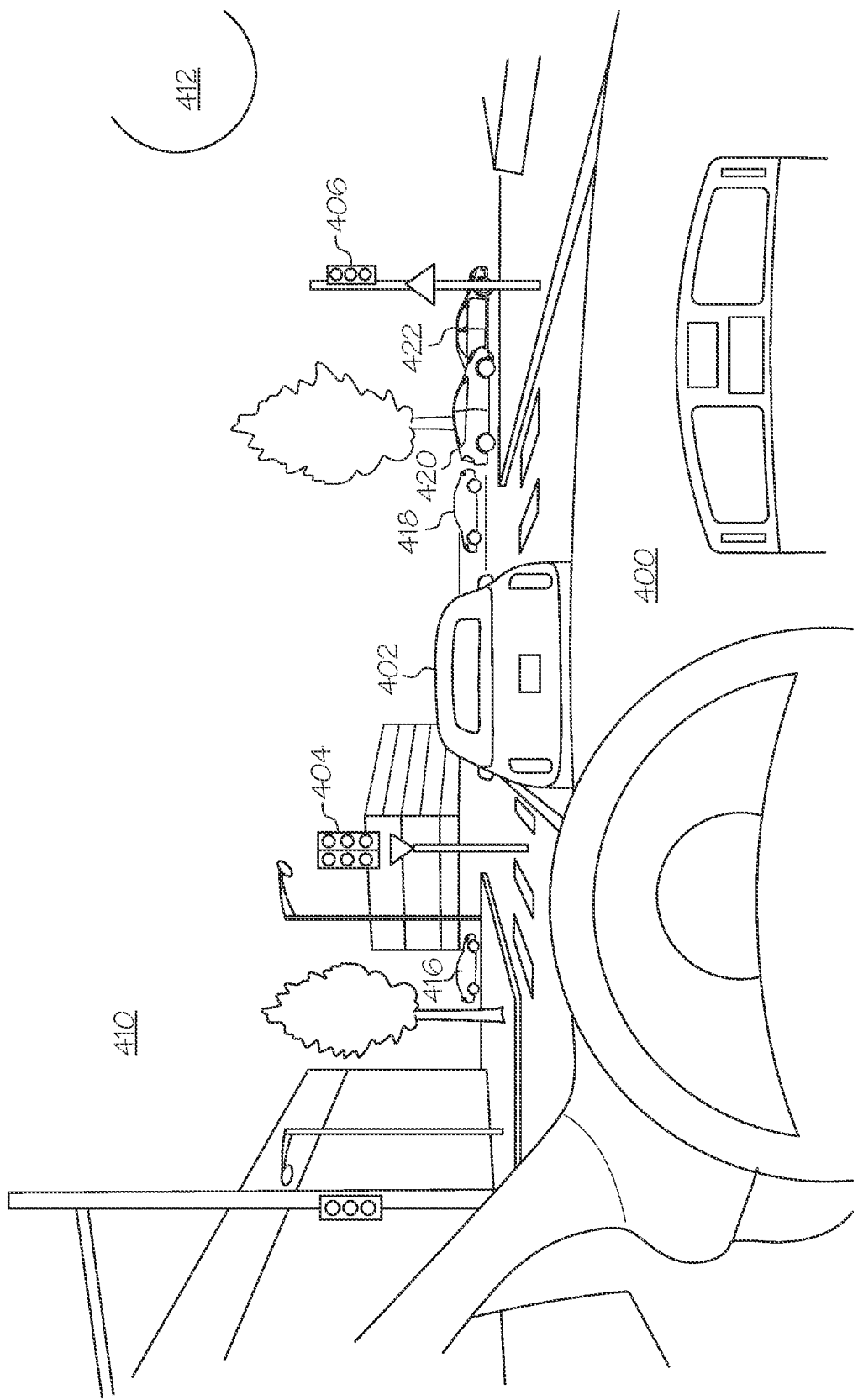
FIG. 4 depicts an illustrative simulation environment implementing multiple portable agents, according to one or more embodiments shown and described herein.

Turning to FIG. 4, an illustrative simulation environment 410 illustrating multiple portable agents is depicted. While the simulator may not always generate a graphical representation of a simulation environment 410, FIG. 4 is provided to help illustrate the concept of agents, their defined behaviors, and the device being simulated within a predefined simulation environment 410. Depicted in FIG. 4, a device, for example, an ego vehicle 400, which may be an autonomous vehicle, is simulated to follow a non-ego vehicle agent 402 through an intersection and follow the appropriate traffic signal indications automatically. The simulation environment 410 includes multiple portable agents including several non-ego vehicle agents 402, 416, 418, 420, and 422. The non-ego vehicle agents each have a predefined set of behaviors that dictate how they will move and interact with the other agents as the simulation steps forward in time.

The environment 410 also includes traffic signal agents 404 and 406. The behavior of the traffic signal agents 404 and 406 may include when they cycle between red, yellow, and green lights. Additionally, other agents such as an environmental condition or weather agent, which in this illustrated environment includes the intensity of the sun agent 412 defines and provides data sources relating to how a driver may react when the intensity of the sun is high or low and the angle at which the sun impacts the driver of a non-ego vehicle agent. For example, during an intense brightness of light at sunrise or sunset, drivers of non-ego vehicles may drive slower or have slower reaction times as they are not able to see far in front of their vehicle. As such, non-ego vehicles driving into the direction of the sun rising or setting may not see a traffic light until they are upon it thereby causing a fast breaking action to stop for a red light. A simulator may seek to test the response of an ego vehicle 400 when non-ego vehicle agents 402, 416, 418, 420, and 422 behave under various environmental conditions.

Figure 5:
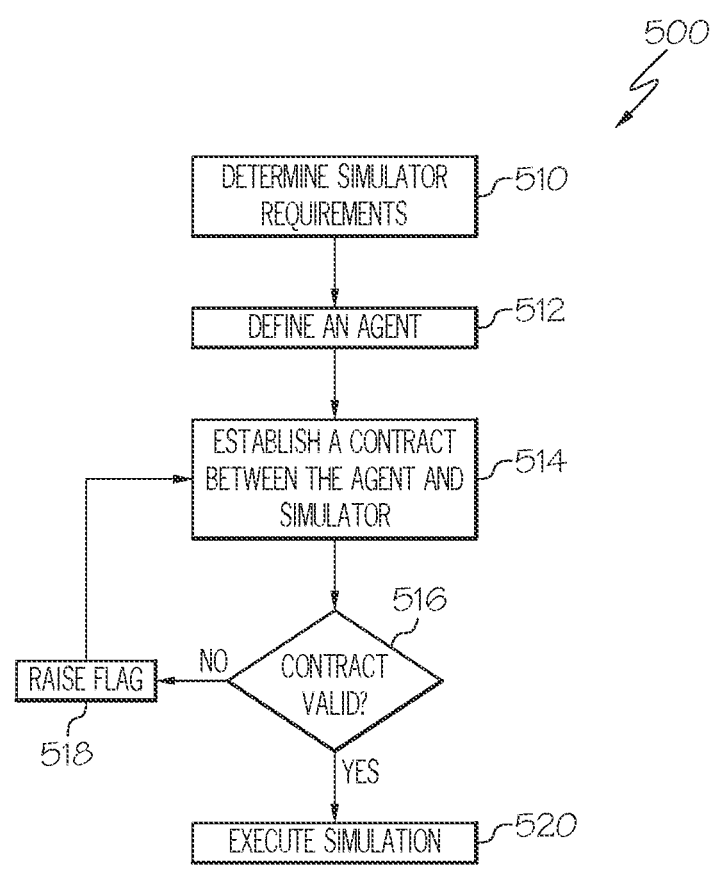
FIG. 5 depicts a flowchart for an example method of implementing portable flexible agents by establishing contracts between the portable flexible agents and the simulator, according to one or more embodiments shown and described herein.

Turning to FIG. 5, a flow diagram 500 for an example method of implementing portable agents with a simulator via a contract is depicted. As described above, the method may be carried out by a computing device 103 or other computing devices 102 or 104. The flow diagram 500 depicted in FIG. 5 is a representation of a machine-readable instruction set stored in the non-transitory computer readable memory 240 (FIG. 2) and executed by the processor 230 (FIG. 2) of the computing device 103. The process of the flow diagram 500 in FIG. 5 may be executed at various times and repeated with various types of simulators.

At block 510, the computing device 103, may determine the requirements of a simulator. That is, based on the type of simulator, the simulation that is prescribed to be carried out, and the device to be simulated, the simulator will require a variety of access to various data sources 238c (FIG. 2). The data sources 238c may be established in a memory component 240 (FIG. 2) or data storage component 236 (FIG. 2). Furthermore, the data sources are updated by agents 238b implemented in the simulation. Accordingly, the computing device 103, at block 512, defines one or more agents 238b that will exist and perform predefined behaviors within the simulation environment. For example, an agent 238b may be a non-ego vehicle agent defined by a sequence of behaviors 238a configured to occur at various times when the simulation is executed by the computing device 103. The behaviors 238a may include how the agent (e.g., a non-ego vehicle agent) will maneuver through the environment and/or how it will react to other agents within the simulation environment. The simulator may be a simulation of an autonomous vehicle traversing an road where one or more other non-ego vehicle agents are traveling and responding to other various agents such as animal agents, pedestrian agents, cyclist agents, or the like that are each configured to behave in a particular manner within the simulation environment as the simulation is executed. Each of the agents within the simulation, in response to the advancement of time by the simulator, execute one or more behaviors and generate data that is updated in its corresponding data sources 238c.

At block 514, the computing device 103, establishes a contract 238d between the one or more agents 238b and the simulator. The contract 238d is interface code that maps data sources of agents to expected inputs of the simulator and outputs of the simulator to the variables or inputs of the agents 238b. The contract 238d may also establish relationships between agents 238b within the simulation environment such that data sources 238c between agents 238b are accessible for reading and in some instances writing or updating, depending on the type of agent 238b and its prescribed behaviors 238a.

By way of example, a simulator may be designed to simulate and test an automatic braking system of an autonomous vehicle (e.g., the device being simulated) in response to braking events of one or more other non-ego vehicle agents in a simulation environment. To perform the simulation, the simulator may require braking values from the one or more other non-ego vehicle agents 238b. The contract 238d established a link and access to the braking values of the one or more other non-ego vehicle agents 238b, if they are available in the data sources associated with the non-ego vehicle agents 238b.

Once a contract 238d is established and before the simulator is executed, the computing device 103, at block 516, may implement validation logic 244c that is configured to determine whether a contract 238d is valid. A determination that a contract 238d is valid is made by determining whether all of the required data sources of the simulator are liked to an agent 238b established in the environment. If a required data source of a simulator is not linked via a contract 238d, then the validation logic may determine that the contract is not valid, "NO" at block 516. In response to a "NO" at block 516, the computing device may activate a flag at block 518. The flag may be an indicator to a test engineer or other aspect of the simulator system that the simulation will not function unless the contract is revised and/or agents 238b redefined or added to the simulation environment. The validation logic 244c implemented at block 516 operates as a logical safeguard to running a simulation that is not fully configured.

If a contract is determined to be valid, "YES" at block 516, then the computing device may advance to block 520 and execute the simulation. Executing the simulation causes the simulator to simulate the device being tested, such as an autonomous vehicle or a component of an autonomous vehicle, in view of the behaviors prescribed by the one or more agents implemented in the simulation environment. Once a first simulation is complete, a computing device 103 may select another simulator, which may be a different type of simulator and execute the method depicted and described with respect to the flow diagram 500 again. However, a test engineer or user does not need to redefine the agents or their behaviors to be compatible with the second simulator. Rather, only a new contract or an update to the existing contract that links the data sources between agents and simulator is implemented. Accordingly, the agents and their behaviors are portable between simulators. Furthermore, a user may develop a library of behaviors 238a and a library of agents 238b that may be capable of being implemented across different types of simulators.

The functional blocks and/or flowchart elements described herein may be translated onto machine-readable instructions or as a computer program product, which when executed by a computing device, causes the computing device to carry out the functions of the blocks. As non-limiting examples, the machine-readable instructions may be written using any programming protocol, such as: descriptive text to be parsed (e.g., such as hypertext markup language, extensible markup language, etc.), (ii) assembly language, (iii) object code generated from source code by a compiler, (iv) source code written using syntax from any suitable programming language for execution by an interpreter, (v) source code for compilation and execution by a just-in-time compiler, etc. Alternatively, the machine-readable instructions may be written in a hardware description language (HDL), such as logic implemented via either a field programmable gate array (FPGA) configuration or an application-specific integrated circuit (ASIC), or their equivalents. Accordingly, the functionality described herein may be implemented in any conventional computer programming language, as pre-programmed hardware elements, or as a combination of hardware and software components.

It should be understood that the embodiments described herein are directed to a simulation system that includes a storage module comprising a plurality of behaviors, and an electronic control unit. The electronic control unit is configured to define an agent for use in a simulation, where the agent comprises one or more of the plurality of behaviors from the storage module and the agent is capable of implementation on a plurality of different simulators, establish a contract with a first simulator and the agent to provide a consistent boundary between the agent and the first simulator, and execute the simulation of a device in a simulation environment with the first simulator and the agent.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A simulation system comprising:
a storage module comprising a plurality of behaviors; and
an electronic control unit configured to:
define an agent for use in a simulation, wherein the agent comprises one or more of the plurality of behaviors from the storage module and the agent is capable of implementation on a plurality of different simulators,
establish a contract with a first simulator and the agent to provide a consistent boundary between the agent and the first simulator, wherein the contract is linking logic that links data sources of the agent with the first simulator such that implementation of the agent with one of the plurality of different simulators is capable through a revision to the contract instead of the agent, and
execute the simulation of a device in a simulation environment with the first simulator and the agent.

2. The simulation system of claim 1, wherein the electronic control unit is further configured to:
validate the contract between the agent and the first simulator prior to executing the simulation, wherein validation determines whether the contract is valid.

3. The simulation system of claim 1, wherein the device is an autonomous vehicle.

4. The simulation system of claim 3, wherein the agent is a second vehicle in the simulation environment of the autonomous vehicle and the one or more of the plurality of behaviors of the agent effects a function of the autonomous vehicle.

5. The simulation system of claim 1, wherein the electronic control unit is further configured to:
establish a second contract with a second simulator and the agent to provide a consistent boundary between the agent and the second simulator, and
execute a second simulation of the device with the second simulator, wherein the second simulator is different than the first simulator.

6. The simulation system of claim 1, wherein the one or more of the plurality of behaviors of the agent are configured in a sequence such that a change in the sequence changes an outcome of the simulation.

7. A method comprising:
defining an agent for use in a simulation, wherein the agent comprises one or more behaviors from a storage module and the agent is capable of implementation on a plurality of different simulators;
establishing a contract with a selected simulator and the agent to provide a consistent boundary between the agent and the selected simulator, wherein the contract is linking logic that links data sources of the agent with the selected simulator such that implementation of the agent with one of the plurality of different simulators is capable through a revision to the contract instead of the agent; and
executing the simulation of a device in a simulation environment with a first simulator and the agent.

8. The method of claim 7, further comprising:
validating the contract between the agent and the first simulator prior to executing the simulation, wherein validation determines whether the contract is valid.

9. The method of claim 7, wherein the device is an autonomous vehicle.

10. The method of claim 9, wherein the agent is a second vehicle in the simulation environment of the autonomous vehicle and the one or more of the plurality of behaviors of the agent effects a function of the autonomous vehicle.

11. The method of claim 7, further comprising:
establishing a second contract with a second simulator and the agent to provide a consistent boundary between the agent and the second simulator; and
executing a second simulation of the device with the second simulator, wherein the second simulator is different than the first simulator.

12. The method of claim 7, wherein the one or more plurality of behaviors of the agent are configured in a sequence such that a change in the sequence changes an outcome of the simulation.

13. A computing program product, the computing program product comprising machine-readable instructions stored on a non-transitory computer readable memory, which when executed by a computing device, causes the computing device to carry out steps comprising:
defining an agent for simulation, wherein the agent comprises one or more behaviors from a storage module and the agent is capable of implementation on a plurality of different simulators;
establishing a contract with a selected simulator and the agent to provide a consistent boundary between the agent and the selected simulator, wherein the contract is linking logic that links data sources of the agent with the selected simulator such that implementation of the agent with one of the plurality of different simulators is capable through a revision to the contract instead of the agent; and
causing a simulator to execute the simulation of a device with a first simulator and the agent.

14. The computing program product of claim 13, the steps caused to be carried out by the computing device further comprising:
validating the contract between the agent and the first simulator prior to executing the simulation, wherein validation determines whether the contract is valid.

15. The computing program product of claim 13, wherein the device is an autonomous vehicle.

16. The computing program product of claim 13, the steps caused to be carried out by the computing device further comprising:
establishing a second contract with a second simulator and the agent to provide a consistent boundary between the agent and the second simulator; and
executing a second simulation of the device with the second simulator, wherein the second simulator is different than the first simulator.

17. The computing program product of claim 13, wherein the one or more behaviors of the agent are configured in a sequence such that a change in the sequence changes an outcome of the simulation.

* * * * *